(12) United States Patent
Chuang

(10) Patent No.: US 9,400,536 B2
(45) Date of Patent: Jul. 26, 2016

(54) ELECTRONIC DEVICE CAPABLE OF AUTOMATICALLY RESETTING AND AUTOMATIC RESETTING METHOD THEREOF

(71) Applicant: Alpha Networks Inc., Hsinchu (TW)

(72) Inventor: Kun-Neng Chuang, Hsinchu (TW)

(73) Assignee: ALPHA NETWORKS INC., Hsinchu (TW)

( * ) Notice: Subject to any disclaimer, the term of this patent is extended or adjusted under 35 U.S.C. 154(b) by 256 days.

(21) Appl. No.: 14/313,535

(22) Filed: Jun. 24, 2014

(65) Prior Publication Data

US 2015/0177803 A1     Jun. 25, 2015

(30) Foreign Application Priority Data

Dec. 24, 2013   (TW) .............................. 102147904 A

(51) Int. Cl.
| G06F 1/26 | (2006.01) |
| G06F 1/24 | (2006.01) |
| G06F 1/28 | (2006.01) |
| H03K 17/22 | (2006.01) |

(52) U.S. Cl.
CPC .. *G06F 1/26* (2013.01); *G06F 1/24* (2013.01); *G06F 1/28* (2013.01); *H03K 17/22* (2013.01)

(58) Field of Classification Search
CPC .................................. G06F 1/26; G06F 1/28
USPC ............................................ 713/1, 300, 310
See application file for complete search history.

(56) References Cited

U.S. PATENT DOCUMENTS

| 4,591,914 A * | 5/1986 | Hakamada ................ G06F 1/24 307/64 |
| 5,157,270 A * | 10/1992 | Sakai ........................ G06F 1/24 307/66 |
| 5,590,280 A * | 12/1996 | Watanabe ................ G06F 1/24 714/55 |
| 5,650,673 A * | 7/1997 | Maeda .................... H03K 17/28 307/125 |
| 6,631,467 B1 * | 10/2003 | Miyamoto ................ G06F 1/24 326/16 |
| 2007/0106915 A1 * | 5/2007 | Shie ........................ G06F 1/24 713/300 |
| 2013/0283071 A1 * | 10/2013 | Ushiro .................... G03G 15/80 713/310 |

* cited by examiner

*Primary Examiner* — Chun Cao
(74) *Attorney, Agent, or Firm* — Bacon & Thomas, PLLC

(57) ABSTRACT

The present invention is to provide an electronic device capable of automatically resetting, which includes a main circuit system and an external circuit system. The main circuit system is able to send out a power supply state signal according to the voltage thereof and an activation state signal according to whether the main circuit system is properly activated. The external circuit system is able to receive the power supply state signal and the activation state signal, switch a switch between a turned-on state and a turned-off state for automatically cutting off electricity supplied to the main circuit system through the switch while the main circuit system is improperly activated and then supplying electricity to the main circuit system thereafter. Thus, whenever the electronic device is improperly activated, the electricity supplied to the main circuit system can be automatically cut off and then restored to reset the main circuit system automatically.

16 Claims, 2 Drawing Sheets

ELECTRONIC DEVICE CAPABLE OF AUTOMATICALLY RESETTING AND AUTOMATIC RESETTING METHOD THEREOF

FIELD OF THE INVENTION

The present invention relates to an electronic device, more particularly to an electronic device capable of automatically being reset by itself when the electronic device is improperly activated.

BACKGROUND OF THE INVENTION

With the continual advancement of microelectronics, the market is now supplied with a variety of electronic devices, which bring tremendous convenience to our daily lives. Generally speaking, these electronic devices are each equipped with an independent control unit for monitoring system operation.

In known electronic device systems, such a control unit can drive each peripheral unit of an electronic device into operation either directly or indirectly (e.g., through hierarchic control). If some peripheral units malfunction during a conventional system operation, the control unit will, upon detecting the abnormal condition, send a deactivation signal or a reset signal to the malfunctioning peripheral units to deactivate or reset the peripheral units, thereby preventing unnecessary disasters attributable to abnormal system operation (e.g., the breakdown of an entire network system due to a malfunctioning network device).

While the aforesaid approach can, to some degree, effectively enable automatic system repair, not all peripheral units can resume normal operation in this way. It has been found that certain peripheral units (e.g., certain chips) do not have a dedicated pin for receiving the reset signal and therefore can only be reset in response to the switching on or off of the power source (generally known as power-on reset). Should this kind of peripheral units malfunction (e.g., in the case of a chip crash), the control unit will be unable to reset the malfunctioning peripheral units in the foregoing manner, thus failing to correct the abnormality in system operation.

The issue to be addressed by the present invention, therefore, is to design an electronic device capable of automatically resetting and an automatic resetting method thereof. It is desirable that, when the electronic device is improperly activated, it will automatically cut off and then restore power supply in order to be automatically reset.

BRIEF SUMMARY OF THE INVENTION

In view of the fact that the abnormality correction mechanisms of the conventional electronic devices are unable to correct all abnormal conditions, the inventor of the present invention incorporated years of practical experience in the related fields into a long-term design, adjustment, and verification process and finally succeeded in developing an electronic device capable of automatically resetting and an automatic resetting method thereof. The present invention is intended to solve all the aforementioned problems of the conventional electronic device systems at once.

It is an objective of the present invention to provide an electronic device capable of automatically resetting. The electronic device includes a main circuit system and an external circuit system. The main circuit system includes a motherboard, a first power receiving unit, a first control unit, and at least one peripheral unit. The first power receiving unit is electrically connected to a power supply unit through a switch. When the switch is in the turned-on state, the first power receiving unit receives electricity from the power supply unit, supplies the electricity to the motherboard and the other elements thereon, and sends out a power supply state signal according to the voltage of the first control unit or the peripheral unit. The first control unit receives electricity from the first power receiving unit and sends out an activation state signal according to whether the main circuit system is properly activated. The peripheral unit receives electricity from the first power receiving unit and is driven by the first control unit. The external circuit system includes a second control unit and a timing unit. The second control unit is electrically connected to the first control unit, the motherboard, and the switch in order to receive the signals sent by the first control unit and the first power receiving unit and switch the switch between the turned-on state and the turned-off state. The timing unit is electrically connected to the second control unit and is driven to time by the second control unit when the second control unit receives electricity from the power supply unit. After a first predetermined time elapses, the second control unit determines whether the activation state signal indicating proper activation of the main circuit system is received. Upon determining that the main circuit system is not properly activated, the second control unit sends a turn off signal to the switch, thereby switching the switch to the turned-off state. When the second control unit subsequently determines, according to the power supply state signal sent by the first power receiving unit, that the main circuit system is not supplied with electricity, the timing unit is again driven to time by the second control unit. After a second predetermined time elapses, the second control unit sends a turn on signal to the switch to switch the switch to the turned-on state. When the second control unit subsequently determines, according to the power supply state signal sent by the first power receiving unit, that the main circuit system is properly supplied with electricity, the timing unit is driven to time once more by the second control unit so that, after the first predetermined time elapses, the second control unit determines whether the activation state signal indicating proper activation of the main circuit system is received. Thus, whenever the electronic device is improperly activated, power supply is automatically cut off and then restored to reset the electronic device automatically.

Another objective of the present invention is to provide a method for automatically resetting an electronic device, wherein the method is applicable to an electronic device including a main circuit system and an external circuit system. The main circuit system includes a motherboard, a first power receiving unit, a first control unit, and at least one peripheral unit. The first power receiving unit, the first control unit, and the peripheral unit are provided on the motherboard and are electrically connected to one another. The first power receiving unit is electrically connected to a power supply unit through a switch. Once the switch is turned on, the first power receiving unit receives electricity from the power supply unit, supplies the electricity to the motherboard, the first control unit, and the peripheral unit, and sends out a power supply state signal according to the voltage of the first control unit or the peripheral unit. The first control unit drives the peripheral unit to perform the functions of the peripheral unit. The external circuit system includes a second control unit and a timing unit. The second control unit is electrically connected to the first control unit, the motherboard, and the switch in order to receive the signals sent by the first control unit and the first power receiving unit and to switch the switch between the turned-on state and the turned-off state. The timing unit is electrically connected to the second control unit. The method includes the following steps to be performed by the second control unit: receiving electricity from the power supply unit and then driving the timing unit to time; receiving an activation state signal from the first control unit after a first predetermined time elapses; if the activation state signal is not received or if the activation state signal indicates that the main circuit system is not properly activated, sending a turn off signal to the switch to switch the switch to the turned-off state; receiving the power supply state signal from the first power receiving unit to confirm that the main circuit system is powered off; driving the timing unit to time; after a second predetermined time elapses, sending a turn on signal to the switch to switch the switch to the turned-on state; receiving the power supply state signal from the first power receiving unit to confirm that the main circuit system is properly supplied with electricity; driving the timing unit to time again, and after the first predetermined time elapses, receiving a second activation state signal from the first control unit; if the activation state signal or the second activation state signal indicates that the main circuit system is properly activated, meaning the electronic device is in normal operation, execution of the method comes to an end. Thus, should abnormality occur when the electronic device is activated, power supply to the electronic device will be automatically cut off and then restored to reset the electronic device automatically.

BRIEF DESCRIPTION OF THE SEVERAL VIEWS OF THE DRAWINGS

The above and other objectives, as well as the technical features and their effects, of the present invention will be best understood by referring to the following detailed description of some illustrative embodiments in conjunction with the accompanying drawings, in which.

DETAILED DESCRIPTION OF THE INVENTION

Figure 1:
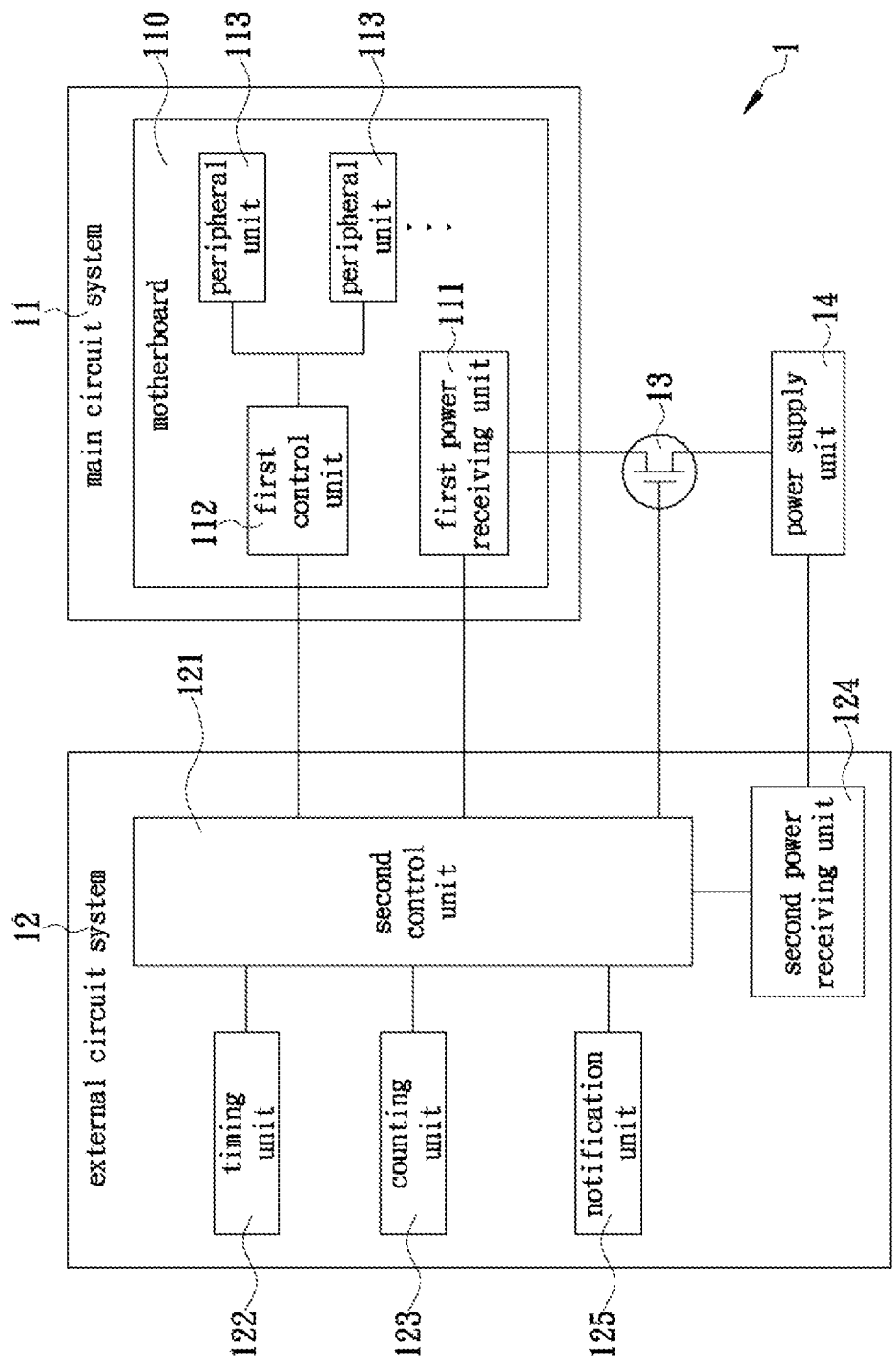
FIG. 1 schematically shows the structure of the electronic device of the present invention.

The present invention relates to an electronic device capable of automatically resetting and an automatic resetting method thereof. Referring to FIG. 1 for a preferred embodiment of the present invention, the method is applicable to an electronic device 1 which includes a main circuit system 11 and an external circuit system 12. The main circuit system 11 includes a motherboard 110 on which at least are provided a first power receiving unit 111, a first control unit 112, and at least one peripheral unit 113 (e.g., a variety of chips or elements). The first power receiving unit 111 is electrically connected to a power supply unit 14 through a switch 13 so that the main circuit system 11 can receive electricity from the power supply unit 14. When the switch 13 is in the turned-on state, the first power receiving unit 111 receives electricity from the power supply unit 14 and supplies the electricity to the motherboard 110, the first control unit 112, and the peripheral unit 113. The peripheral unit 113 can be driven to perform its functions by the first control unit 112. In this preferred embodiment, the first power receiving unit 111 can send out a power supply state signal according to the voltage of the first control unit 112 or the peripheral unit 113, and the first control unit 112 can send out an activation state signal according to the operating condition of the peripheral unit 113.

As shown in FIG. 1, the external circuit system 12 includes a second control unit 121 and a timing unit 122. The second control unit 121 is electrically connected to the first control unit 112, the motherboard 110, and the switch 13 in order to receive the activation state signal sent by the first control unit 112 and the power supply state signal sent by the first power receiving unit 111. According to the activation state signal and the power supply state signal received, the second control unit 121 switches the switch 13 between the turned-on state and the turned-off state. The timing unit 122 is electrically connected to the second control unit 121 and can be driven to time by the second control unit 121. In this preferred embodiment, the external circuit system 12 further includes a counting unit 123 and a second power receiving unit 124 as detailed further below.

To clearly demonstrate the process flow of the present invention, the major steps are now described with reference to the flowchart of FIG. 2 and the reference numerals in FIG. 1. When the electronic device 1 carries out the method of the present invention, the second control unit 121 performs the following steps:

(201) The second control unit 121 receives electricity from the power supply unit 14.

(202) The second control unit 121 drives the timing unit 122 to time.

(203) After a first predetermined time elapses, the second control unit 121 determines whether an activation state signal indicating proper activation is received. The process ends if yes, and step (204) is performed if no.

(204) The second control unit 121 sends a turn off signal to the switch 13 and thereby turns off the switch 13.

(205) The second control unit 121 drives the counting unit 123 to count the number of times of resetting, and the second control unit 121 adjusts the settings accordingly.

(206) The second control unit 121 receives the power supply state signal from the first power receiving unit 111 to confirm that the main circuit system 11 is in the powered-off state. The same step is repeated if the main circuit system 11 is not completely powered off, and step (207) is performed if the main circuit system 11 is in the powered-off state.

(207) The second control unit 121 drives the timing unit 122 to time.

(208) After a second predetermined time elapses, the second control unit 121 sends a turn on signal to the switch 13 to turn on the switch 13.

(209) The second control unit 121 receives the power supply state signal from the first power receiving unit 111 to confirm that electricity is properly supplied to the main circuit system 11. Then, the process returns to step (202).

In the foregoing process, if the electronic device 1 works properly as a whole, the second control unit 121 will receive in step (203) an activation state signal that indicates proper activation, meaning the electronic device 1 is in normal operation. If the first control unit 112 detects any abnormality in the operation of the peripheral unit 113, the first control unit 112 will send to the second control unit 121 an activation state signal that signifies abnormality. Or, if the first control unit 112 itself malfunctions, the second control unit 121 won't be able to receive any activation state signal from the first control unit 112. In either of the above two cases, the electronic device 1 enters the resetting process of the present invention, in which process the second control unit 121 automatically cuts off and then restores power supply to the electronic device 1 to reset the electronic device 1 automatically.

The above process flow is further detailed as follows. Referring to FIG. 1 and FIG. 2, when the electronic device 1 is activated in step (201), the power supply unit 14 not only supplies electricity to the main circuit system 11 through the first power receiving unit 111, but also supplies electricity to the external circuit system 12 through the second power receiving unit 124. However, the present invention is not limited to this circuit design. In other embodiments of the present invention, the external circuit system 12 may dispense with the second power receiving unit 124 and be powered directly by the power supply unit 14. Alternatively, the external circuit system 12 may be powered by a power supply unit (not shown) other than the power supply unit 14 of the main circuit system 11 (e.g., a built-in battery in the external circuit system 12 or a power source independent of the main circuit system 11). In either case, the intended effects of the present invention can be achieved.

Moreover, the first control unit 112 must take some time to complete initialization after the main circuit system 11 is activated, or the first control unit 112 simply cannot function. Therefore, in order to prevent the second control unit 121 from misjudging the main circuit system 11 as improperly activated, the second control unit 121 must in step (202) drive the timing unit 122 to time first so that the preset first predetermined time reasonably ensures the first control unit 112 is in working order. Then, after the first predetermined time elapses, and based on the activation state signal sent by the first control unit 112, the second control unit 121 determines in step (203) whether the main circuit system 11 is in normal operation.

Figure 2:
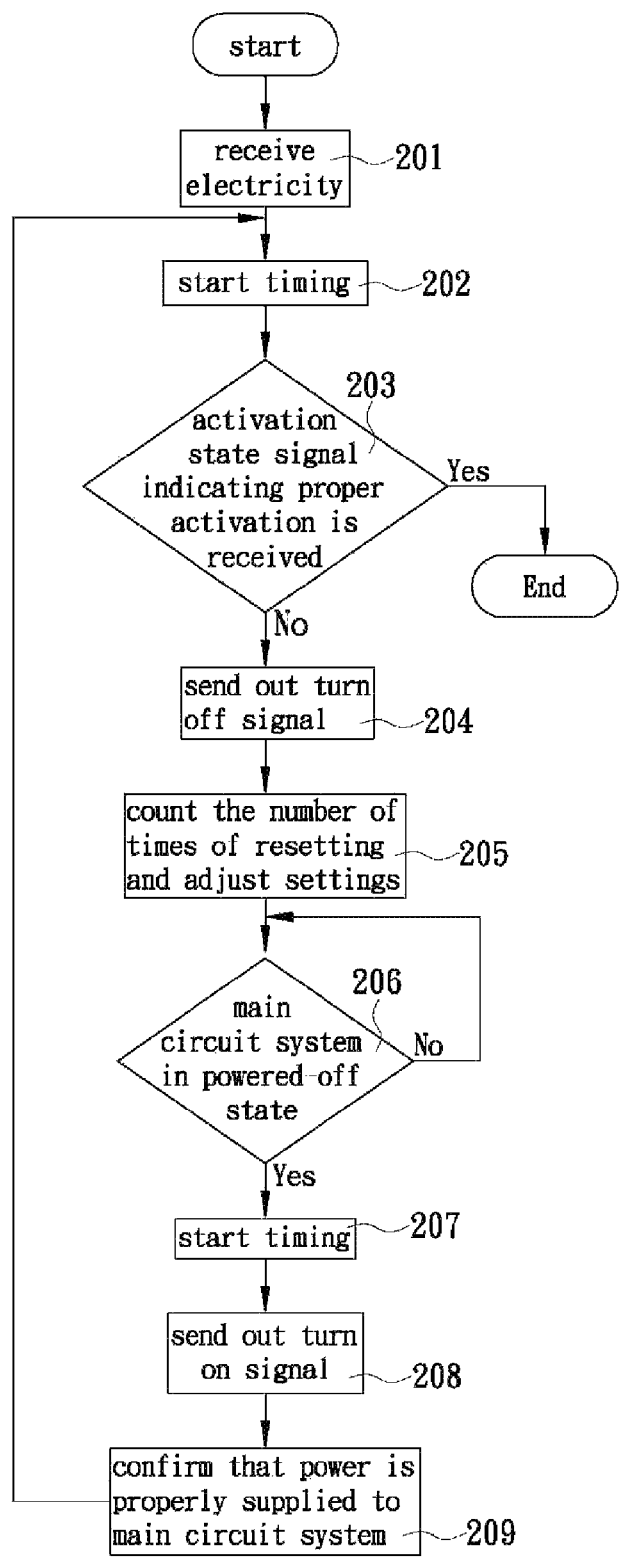
FIG. 2 is a flowchart of the major steps of the present invention.

With continued reference to FIG. 1 and FIG. 2, once the peripheral unit 113 of the electronic device 1 malfunctions, the first control unit 112 will first correct the abnormal condition with the conventional approach (e.g., by sending a deactivation signal or a resetting signal to the malfunctioning peripheral unit 113 to deactivate or reset the peripheral unit 113). If the conventional approach does not work, the first control unit 112 will send to the second control unit 121 an activation state signal indicating abnormality. In other words, if, after the electronic device 1 has been activated and the first predetermined time has elapsed, or after the electronic device 1 has been properly activated and in operation for some time, the second control unit 121 receives from the first control unit 112 an activation state signal indicating abnormality (e.g., when the peripheral unit 113 experiences a chip crash) or never receives any activation state signal from the first control unit 112 (e.g., when the first control unit 112 itself malfunctions), there must be something wrong with the electronic device 1. Hence, in step (204), the second control unit 121 sends the turn off signal to the switch 13 to turn off the switch 13, thereby cutting off the power supply to the main circuit system 11 completely and forcing the main circuit system 11 to stop operation. Thus, the goal of "effecting automatic power-off" is achieved.

Continued from above, once the goal of "effecting automatic power-off" is achieved, it is necessary to "effect automatic power restoration" in order to attain the ultimate goal of "automatically resetting the electronic device". It should be pointed out that, if the abnormal condition of the electronic device 1 cannot be corrected after the electronic device 1 has been reset several times, the second control unit 121 in step (205) of this preferred embodiment will have counted, through the counting unit 123, the number of times for which the main circuit system 11 has been reset because of the abnormal condition. When the number of times of resetting reaches a threshold value, the condition of resetting (e.g., the time interval between each two successive instances of resetting) is adjusted, or system resetting is halted. In the latter case, a notification unit 125 (e.g., an LED light) is driven to display a notification message in order for the manager of the electronic device 1 to correct the abnormal condition manually (e.g., to perform hardware inspection and repair).

Referring again to FIG. 1 and FIG. 2, if the second control unit 121 determines that the main circuit system 11 needs resetting (e.g., when the number of times of resetting has yet to reach the threshold value), step (206) requires the second control unit 121 to further determine, according to the power supply state signal sent by the first power receiving unit 111, whether the main circuit system 11 is in the powered-off state (discharge completed). This is because the peripheral unit 113, if not fully discharged, may be incompletely reset or even damaged when the main circuit system 11 is powered on again. After it is confirmed that the main circuit system 11 is fully discharged, the second control unit 121 drives the timing unit 122 to time in steps (207) and, after the second predetermined time elapses, sends the turn on signal to the switch 13 to turn on the switch 13 in step (208). Thus, it can be ensured that the main circuit system 11 will not be powered on and activated until it is fully discharged. After the main circuit system 11 is powered on and activated again, the second control unit 121 will confirm, according to the power supply state signal sent by the first power receiving unit 111, that electricity is properly supplied to the main circuit system 11. Then, the process returns to step (202). After the lapse of the first predetermined time, the second control unit 121 continues to monitor whether the first control unit 112 sends out the activation state signal indicating normal operation of the main circuit system 11.

The method of the present invention is so designed that, regardless of whether the peripheral unit 113 has a dedicated reset signal pin, the electronic device 1 will be automatically powered off upon occurrence of an abnormal condition and then powered on in order to be automatically reset.

While the invention herein disclosed has been described by means of specific embodiments, numerous modifications and variations could be made thereto by those skilled in the art without departing from the scope of the invention set forth in the claims.

What is claimed is:

1. A method for automatically resetting an electronic device, the method being applicable to an electronic device comprising a main circuit system and an external circuit system, the main circuit system comprising a motherboard provided thereon at least with a first power receiving unit, a first control unit, and at least one peripheral unit, the first power receiving unit being electrically connected to a power supply unit through a switch, wherein when the switch is in a turned-on state, the first power receiving unit receives electricity from the power supply unit, supplies the electricity to the motherboard, the first control unit, and the peripheral unit, and sends out a power supply state signal according to voltage of the first control unit or of the peripheral unit, the first control unit being configured for driving the peripheral unit to perform functions thereof; the external circuit system comprising a second control unit and a timing unit, the second control unit being electrically connected to the first control unit, the motherboard, and the switch in order to receive signals sent by the first control unit and the first power receiving unit and switch the switch between the turned-on state and a turned-off state, the timing unit being electrically connected to the second control unit, the method comprising the steps, to be performed by the second control unit, of:

receiving the electricity from the power supply unit, and then driving the timing unit to time;

receiving an activation state signal from the first control unit after a first predetermined time elapses;

sending a turn off signal to the switch to switch the switch to the turned-off state, if the activation state signal is not received or if the activation state signal indicates improper activation of the main circuit system;

receiving the power supply state signal from the first power receiving unit to confirm that the main circuit system is in a powered-off state;

driving the timing unit to time;

sending a turn on signal to the switch to switch the switch to the turned-on state, after a second predetermined time elapses;

receiving the power supply state signal from the first power receiving unit to confirm that the main circuit system is properly supplied with power;

driving again the timing unit to time, and after the first predetermined time elapses, receiving a second activation state signal from the first control unit; and terminating execution of the method when the activation state signal or the second activation state signal indicates proper activation of the main circuit system.

2. The method of claim 1, wherein the external circuit system further comprises a counting unit electrically connected to the second control unit, the method further comprising the steps, to be performed by the second control unit, of:

driving the counting unit to count the number of times for which the main circuit system has been reset; and adjusting a condition of resetting or stopping system resetting, when the number of times for which the main circuit system has been reset reaches a threshold value.

3. The method of claim 2, further comprising the step, to be performed by the second control unit when adjusting the condition of resetting, of:

adjusting a time interval between each two successive instances of resetting.

4. The method of claim 2, wherein the external circuit system further comprises a notification unit, the method further comprising the step, to be performed by the second control unit after the second control unit stops system resetting, of:

driving the notification unit to display a notification message.

5. The method of claim 4, wherein the second control unit is electrically connected to the power supply unit to directly receive the electricity provided by the power supply unit.

6. The method of claim 4, wherein the second control unit is electrically connected to a second power supply unit to receive electricity provided by the second power supply unit.

7. The method of claim 4, wherein the external circuit system further comprises a second power receiving unit electrically connected to the power supply unit, and the second power receiving unit receives the electricity from the power supply unit and supplies the electricity to the external circuit system.

8. The method of claim 4, wherein the external circuit system further comprises a second power receiving unit electrically connected to a second power supply unit, and the second power receiving unit receives electricity from the second power supply unit and supplies the electricity to the external circuit system.

9. An electronic device capable of automatically resetting, the electronic device comprising:

a main circuit system comprising:

a motherboard;

a first power receiving unit provided on the motherboard, the first power receiving unit being electrically connected to a power supply unit through a switch, wherein when the switch is in a turned-on state, the first power receiving unit receives electricity from the power supply unit and supplies the electricity to the motherboard and other elements provided thereon;

a first control unit provided on the motherboard in order to receive the electricity from the first power receiving unit through the motherboard, wherein the first power receiving unit is configured for detecting voltage of the first control unit and sending out a power supply state signal according to the voltage of the first control unit, and the first control unit is configured for sending out an activation state signal according to whether the main circuit system is properly activated; and at least one peripheral unit provided on the motherboard in order to receive the electricity from the first power receiving unit through the motherboard, wherein the first power receiving unit is configured for detecting voltage of the peripheral unit and sending out a power supply state signal according to the voltage of the peripheral unit, and the peripheral unit is electrically connected to the first control unit in order to be driven thereby; and an external circuit system comprising:

a second control unit electrically connected to the first control unit, the first power receiving unit, and the switch in order to receive signals sent by the first control unit and the first power receiving unit and switch the switch between the turned-on state and a turned-off state; and a timing unit electrically connected to the second control unit, wherein: the timing unit is driven to time by the second control unit when the second control unit receives the electricity from the power supply unit; after a first predetermined time elapses, the second control unit determines whether the activation state signal indicating proper activation of the main circuit system is received; upon determining that the main circuit system is not properly activated, the second control unit sends a turn off signal to the switch to switch the switch to the turned-off state; then, the timing unit is once again driven to time by the second control unit when the second control unit determines, according to the power supply state signal sent by the first power receiving unit, that the main circuit system is in a powered-off state; after a second predetermined time elapses, the second control unit sends a turn on signal to the switch to switch the switch to the turned-on state; the timing unit is again driven to time by the second control unit when the second control unit determines, according to the power supply state signal sent by the first power receiving unit, that the main circuit system is properly supplied with power; and after the first predetermined time elapses, the second control unit determines once again whether the activation state signal indicating proper activation of the main circuit system is received.

10. The electronic device of claim 9, wherein the external circuit system further comprises a counting unit electrically connected to the second control unit, the counting unit being drivable by the second control unit to count the number of times for which the main circuit system has been reset, in order for the second control unit to adjust a condition of resetting or stop system resetting when the number of times for which the main circuit system has been reset reaches a threshold value.

11. The electronic device of claim 10, wherein the second control unit adjusts the condition of resetting by adjusting a time interval between each two successive instances of resetting.

12. The electronic device of claim 10, wherein the external circuit system further comprises a notification unit, and the notification unit is driven to display a notification message by the second control unit after the second control unit stops system resetting.

13. The electronic device of claim 12, wherein the second control unit is electrically connected to the power supply unit in order to directly receive the electricity provided by the power supply unit.

14. The electronic device of claim 12, wherein the second control unit is electrically connected to a second power supply unit in order to received electricity provided by the second power supply unit.

15. The electronic device of claim 12, wherein the external circuit system further comprises a second power receiving unit electrically connected to the power supply unit, and the second power receiving unit receives the electricity from the power supply unit and supplies the electricity to the external circuit system.

16. The electronic device of claim 12, wherein the external circuit system further comprises a second power receiving unit electrically connected to a second power supply unit, and the second power receiving unit receives electricity from the second power supply unit and supplies the electricity to the external circuit system.

* * * * *